United States Patent [19]
Pan et al.

[11] Patent Number: 5,895,945
[45] Date of Patent: Apr. 20, 1999

[54] SINGLE POLYSILICON NEURON MOSFET

[75] Inventors: Hong-Tsz Pan, Chang-hua; Chung-Cheng Wu, I-Lan; Ming-Tzong Yang, Hsin Chu, all of Taiwan

[73] Assignee: United Microelectronics Corporation, Hsin-Chu, Taiwan

[21] Appl. No.: 08/791,596

[22] Filed: Jan. 31, 1997

Related U.S. Application Data

[62] Division of application No. 08/557,546, Nov. 14, 1995, Pat. No. 5,650,346.

[51] Int. Cl.$^6$ ............................................. H01L 27/108
[52] U.S. Cl. ...................... 257/300; 257/318; 257/319; 257/371; 257/379
[58] Field of Search .................... 257/300, 318, 257/319, 320, 321, 322, 326, 345, 369, 371, 379

[56] References Cited

U.S. PATENT DOCUMENTS

| | | | |
|---|---|---|---|
| 4,035,820 | 7/1977 | Matzen | 357/23 |
| 4,211,941 | 7/1980 | Schado, Jr. | 307/303 |
| 4,425,631 | 1/1984 | Adam | 365/185 |
| 4,805,071 | 2/1989 | Hutter et al. | 361/313 |
| 4,841,352 | 6/1989 | Aso | 357/45 |
| 4,890,191 | 12/1989 | Rokos | 361/313 |
| 4,992,980 | 2/1991 | Park et al. | 365/104 |
| 5,018,000 | 5/1991 | Yamada et al. | 357/51 |
| 5,038,184 | 8/1991 | Chiang et al. | 357/14 |
| 5,119,267 | 6/1992 | Sano et al. | 362/311 |
| 5,215,934 | 6/1993 | Tzeng | 437/43 |
| 5,637,896 | 6/1997 | Huang | 257/316 |

Primary Examiner—Sara Crane
Attorney, Agent, or Firm—Rabin & Champagne, P.C.

[57] ABSTRACT

A MOSFET device with a substrate covered with dielectric material with the device including a plurality of buried conductors capacitively coupled to a polysilicon electrode, made by the steps comprising forming between regions containing MOSFET devices a region with a plurality of bit lines in the substrate by ion implantation through the gate oxide into the substrate in a predetermined pattern and, forming a polysilicon electrode on the dielectric material crossing over the bit lines.

10 Claims, 3 Drawing Sheets

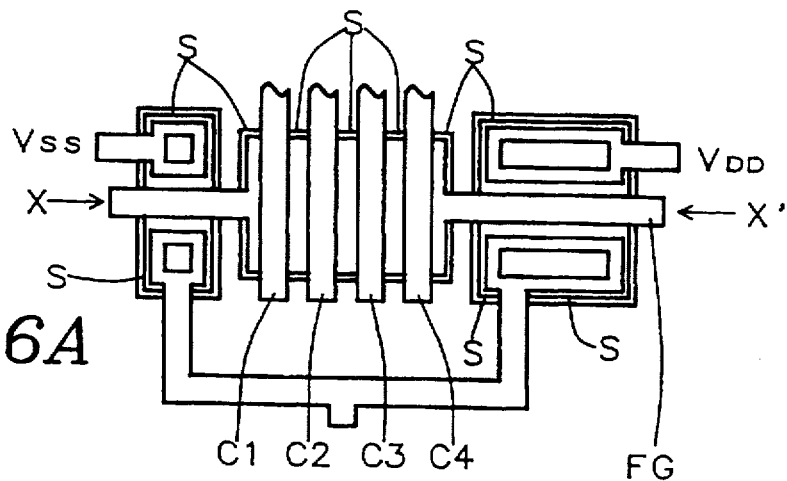
FIG. 6A
Prior Art
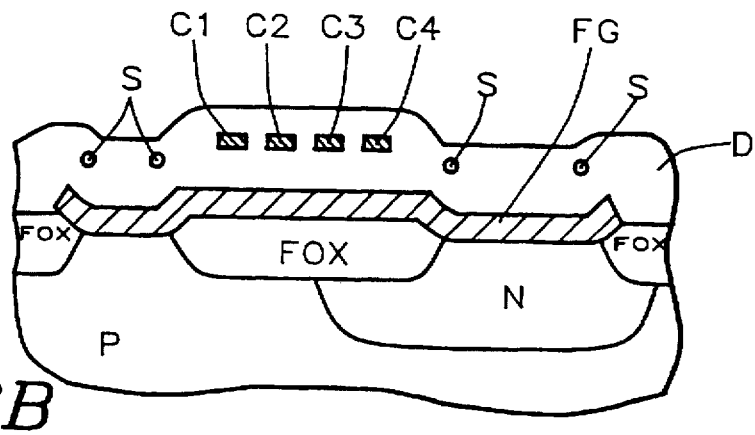
FIG. 6B
Prior Art
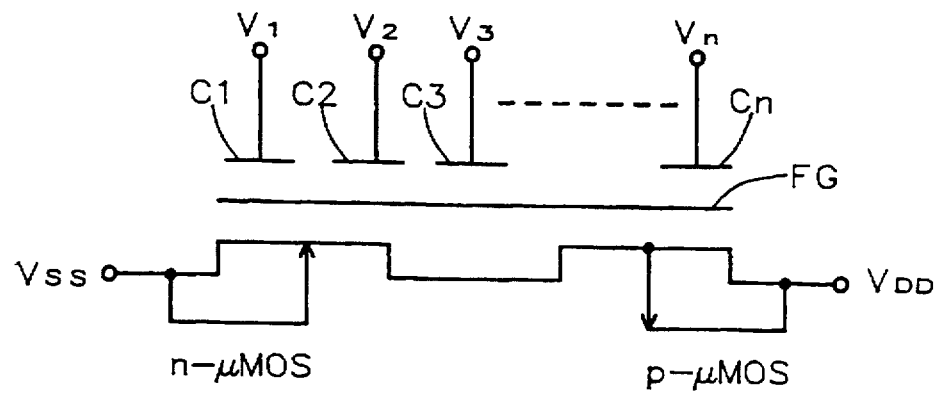
FIG. 6C – Prior Art

SINGLE POLYSILICON NEURON MOSFET

This is a division of application Ser. No. 08/557,546, filed on Nov. 14, 1995, U.S. Pat. No. 5,650,346.

BACKGROUND OF THE INVENTION

1. Field of the Invention

This invention relates to MOSFET semiconductor devices and more particularly to capacitive structures therein.

2. Description of Related Art

The "neuron" MOSFET (neuMOS or nu(Greek symbol) MOS) (so named because it is considered to be analogous in function to a biological neuron) with double polysilicon utilized as coupling capacitor has the problem of polysilicon stringers which are unwanted fragments of polysilicon which can cause shorting between lines. One way of removing stringers is by overetching, but this causes a problem of a narrowing of the oxide layer which can cause short circuiting through the interpolysilicon oxide layer between the polysilicon 1 layer and the polysilicon 2 layer.

FIGS. 6A-6C show a prior art device.

FIG. 6A is a plan view with input gate lines C1, C2, C3 and C4, a $V_{SS}$ line, a $V_{DD}$ line, and a floating gate FG.

FIG. 6B is a section taken along line X-X' in FIG. 6A through floating gate FG. The substrate includes a P-silicon substrate with an N region separated by FOX regions and with a floating gate overlying the N region, the FOX regions and the P-sub. The input gate lines $C_1$, $C_2$, $C_3$ and $C_4$ are located above the floating gate FG, separated by dielectric D. In the dielectric D in FIGS. 6A and 6B are stringers S, about the periphery of $V_{SS}$ line, a $V_{DD}$ line, and a floating gate FG.

The circuit of the device of FIGS. 6A and 6B is shown in FIG. 6C with conductors $C_1$, $C_2$, $C_3$ . . . $C_n$ connected to voltage sources $V_1$, $V_2$, $V_3$ . . . $V_n$, floating gate FG and the transistors below connected to $V_{SS}$ and $V_{DD}$.

See Shibata et al "Functional MOS Transistor Featuring Gate-Level Weighted Sum and Threshold Operations", IEEE Transactions on Electron Devices, Vol. 39, No. 6, p 1444-1455 (June, 1992) which has the stringer problems described above, although they are not described there.

U.S. Pat. No. 5,215,934 of Tzeng shows a different thickness depending upon where the ion implantation has been applied or is absent from the silicon surface with argon, boron, antimony, arsenic, or any group III or IV dopant applied for enhancing the rate of oxidation in silicon which has been damaged by the process of implantation of such dopants. The variable thickness is employed for providing a two-tiered tunnel oxide upon which a floating gate and control gate are formed across the two tiers for the purpose of as stated at Col. 7, lines 11-12 "reducing drain disturbance in EEPROM arrays . . . " It also states at Col. 2, lines 52-54 "it is also desired to thicken the gate oxide near the drain region to reduce drain disturbance phenomena . . . "

U.S. Pat. No. 5,038,184 Chiang et al shows a thin film varactor structure.

U.S. Pat. No. 5,119,267 of Sano et al, U.S. Pat. No. 5,018,000 of Yamada et al, U.S. Pat. No. 4,890,191 of Rokos; U.S. Pat. No. 4,841,320 of Aso; U.S. Pat. No. 4,805,071 of Hutter et al; and U.S. Pat. No. 4,211,941 of Schade show processes for making capacitors. However, these processes fail to form a CMOS neuron device.

SUMMARY OF THE INVENTION

One major advantage of this invention is a shorter process cycle time as compared to the double polysilicon process of the prior art.

A MOSFET device with a substrate covered with dielectric material with the device including a plurality of buried conductors capacitively coupled to a polysilicon electrode, made by the steps comprising forming between regions containing MOSFET devices a region with a plurality of bit lines in the substrate by ion implantation through the gate oxide into the substrate in a predetermined pattern and, forming a polysilicon electrode on the dielectric material crossing over the bit lines.

Preferably, the bit lines are formed in a region between regions containing MOSFET devices and a plurality of N-wells and P-wells formed in the substrate prior to forming the bit lines, with the buried bit lines being formed in one of the wells.

Preferably, an ion implantation is performed to form PMOS and NMOS devices in adjacent wells.

Preferably, the MOSFET device comprises a substrate covered with dielectric material with the device including a plurality of buried conductors capacitively coupled to a polysilicon electrode, the steps comprising forming a gate oxide and regions of field oxide of the surface of the substrate, forming a buried bit lines mask, forming between regions containing MOSFET devices a plurality of bit lines in the substrate by ion implantation through the gate oxide into the substrate in a predetermined pattern and, forming a blanket polysilicon layer, and forming a mask on the polysilicon layer to form a conductor crossing over the bit lines.

Preferably, a plurality of N-wells and P-wells are formed in the substrate prior to forming the bit lines, with the buried bit lines being formed in one of the wells.

Preferably, the polysilicon electrode comprises a floating conductor, forming a second layer of dielectric material over the polysilicon electrode, forming second polysilicon conductors over the second layer of dielectric material crossing over the floating conductor.

Preferably, a plurality of N-wells and P-wells are formed in the substrate prior to forming the bit lines, and the field oxide regions are formed over the junctions between the P-wells and N-wells, with the buried bit lines being formed in one of the wells.

Preferably, the second polysilicon conductors comprise input electrodes.

Preferably, the floating electrode comprises a floating gate and second polysilicon conductor comprises input electrodes.

BRIEF DESCRIPTION OF THE DRAWINGS

The foregoing and other aspects and advantages of this invention are explained and described below with reference to the accompanying drawings, in which:

FIGS. 6A–6C show a prior art device.

FIG. 6A is a plan view with input gate lines, a $V_{SS}$ line, a $V_{DD}$ line, and a floating gate FG.

FIG. 6B is a section taken along line X-X' in FIG. 6A through floating gate FG. The substrate includes a P-silicon substrate with an N region separated by FOX regions and with a floating gate overlying the N region, the FOX regions and the P-sub. The input gate lines are located above the floating gate FG, separated by dielectric. In the dielectric in FIGS. 6A and 6B are stringers S, about the periphery of $V_{SS}$ line, a $V_{DD}$ line, and a floating gate FG.

The circuit of the device of FIGS. 6A and 6B is shown in FIG. 6C with conductors connected to voltage sources, floating gate and the transistors below connected to $V_{SS}$ and $V_{DD}$.

DESCRIPTION OF THE PREFERRED EMBODIMENT

This invention, which provides a neuron MOSFET with single polysilicon combined with buried N+ as the coupling capacitor electrodes, has the advantages that the process is easier and the product is free from the problems of polysilicon stringers.

PROCESS

Front End Process

Figure 1:
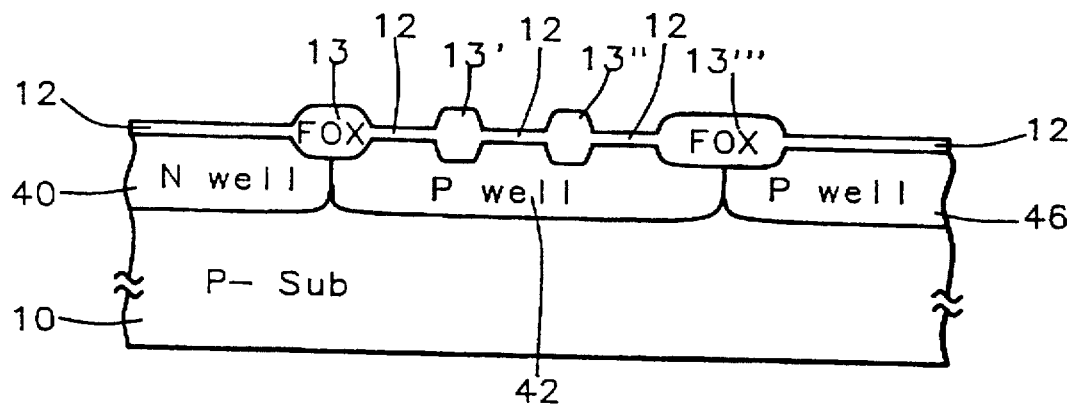
FIG. 1 shows a cross sectional view of device being manufactured in accordance with this invention in an early stage of its process of manufacture with a semiconductor substrate with P- and N- wells therein and gate and FOX silicon dioxide layers thereon.

FIG. 1 shows a cross sectional view of device being manufactured in accordance with this invention in an early stage of its process of manufacture. A substrate 10 of silicon doped as a P-sub with an N-well 40 on the left, a P-well 42 in the center, and a P-well 46 on the right.

Gate Oxidation

By a process of gate oxidation the wells 40, 42, and 46 are covered with a gate oxide layer 12. The gate oxide layer 12 alternates with field oxide (FOX) regions 13, 13', 13", and 13'" formed by oxidation of the surfaces of gate oxide layer 12. FOX region 13 is formed over the junction of N-well 40 and P-well 42. FOX region 13"" is formed over the junction of P-well 42 and P-well 46. Fox regions 13' and 13" are formed centrally over the P-well 42. The gate oxide 12 is grown to a thickness of about 200 Å. A range of gate oxide thicknesses from about 60 Å to about 600 Å is possible. The gate oxide layer and the field oxide (FOX) structures are grown separately. The FOX structures are formed first. The gate oxide layer is formed later. Both the FOX structures and the gate oxide layers are formed by means of a conventional process.

The FOX regions are formed after the regions of the N-wells and the P-wells have been ion implanted with a dopant comprising $P^{31}$ for the N-well and $BF_2$ or $B^{11}$ for the P-wells, which are made in advance.

Buried Bit Line Mask and Implantation

Figure 2:
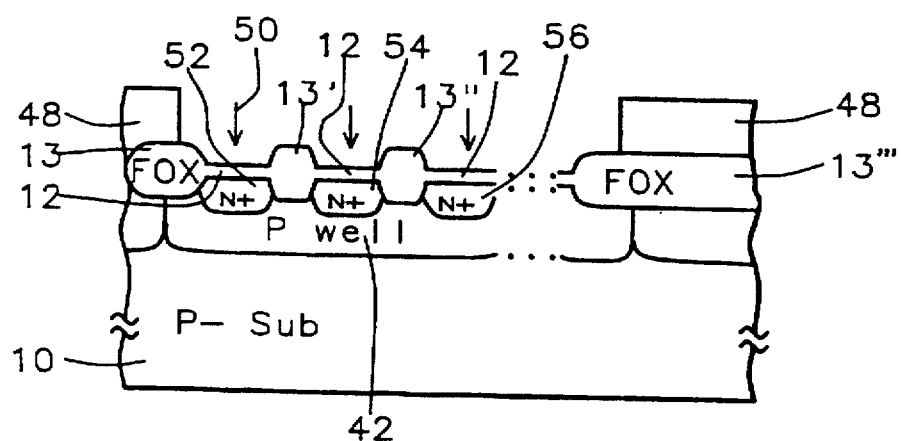
FIG. 2 shows the product of FIG. 1 after a buried bit line N+ mask has been applied thereto followed by ion implantation and formation of buried bit lines to serve as lower coupling capacitor electrodes.

Referring to FIG. 2, a buried bit line N+ mask has been applied to the product of FIG. 1 and then an N+ implant of arsenic (As) or $P^{31}$ ions 50 is implanted forming N+ buried bit lines 52, 54 and 56 in P-well 42 between FOX regions 13, 13' and 13", which will form the coupling capacitor electrodes. The implantation is performed preferably with an energy of about 90 keV. A range of energies from about 30 keV to about 200 keV is possible. The dose is preferably $3\times10^{15}/cm^2$ of As. A range of doses from about $5\times10^{14}$/ions/$cm^2$ to about $2\times10^{16}$/ions/$cm^2$ is possible. The interrelationship between the energy and the dose is that for higher energies, the dose is less. Outside of those ranges, the result is unacceptable because the N+ junctions fail to be formed under those conditions.

Polysilicon Deposition and Etching

Figure 3:
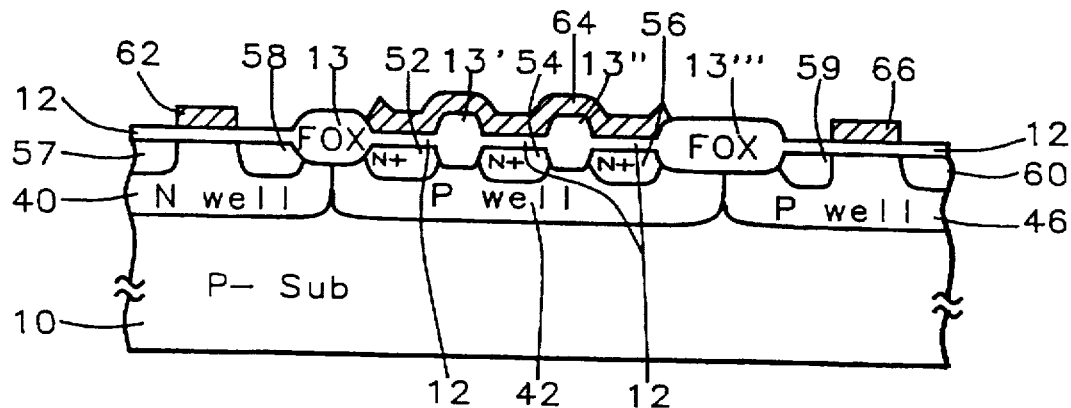
FIG. 3 shows a product of the process of FIG. 2 after formation a polysilicon 1 blanket layer from which upper capacitor electrode structures were formed on the surface of a gate oxide layer, including a plate of a floating gate coupler serving as a control gate structure, with source and drain implantations adjacent to the gate coupler.

Referring to FIG. 3 a polysilicon 1 blanket layer from which electrode structures 62, 64, 66 were formed has been deposited on the surface of gate oxide layer 12, and the FOX regions 13, 13', and 13" of FIG. 2. The polysilicon 1 layer is doped with phosphorous $P^{31}$ to a dose of 1 E 16 ions/$cm^2$ at an energy of 50 keV. Then a mask is formed on the polysilicon 1 layer and used to etch the polysilicon 1 blanket layer forming polysilicon 1 electrode structures 62, 64, and 66 as seen in FIG. 3.

Structure 64 comprises a plate of a floating gate coupler which lies on the buried N+ regions 52, 54 and 56 as a control gate structure. A thin gate oxide layer 12 (having a thickness of about 200 Å) is located between polysilicon 1 structure 64, and buried N+ regions 52, 54 and 56. Gate oxide layer 12 is also located between electrodes 62 and 66 and N-well 40 and P-well 46 respectively.

N+ and P+ Ion Implantation

Next, source and drain implantations are performed in accordance with the state of the art. The PMOS device includes an N well 40 with P+ S/D regions 57 and 58 formed on either side of polysilicon 1 structure 62. In the NMOS device in P well 46 S/D N+ regions 59 and 60 are formed on either side of polysilicon 1 structure 66.

Standard Process

The standard process follows. That process comprises N/P well formation, field isolation, buried N+ masking and ion implantation, gate oxidation, polysilicon deposition, polysilicon ion implantation and annealing, polysilicon masking and etching, N+ masking and ion implantation, P+ masking and ion implantation, BPSG dielectric deposition and reflow, contact masking and etching, metal sputtering, metal masking and etching, and then passivation.

Figure 4:
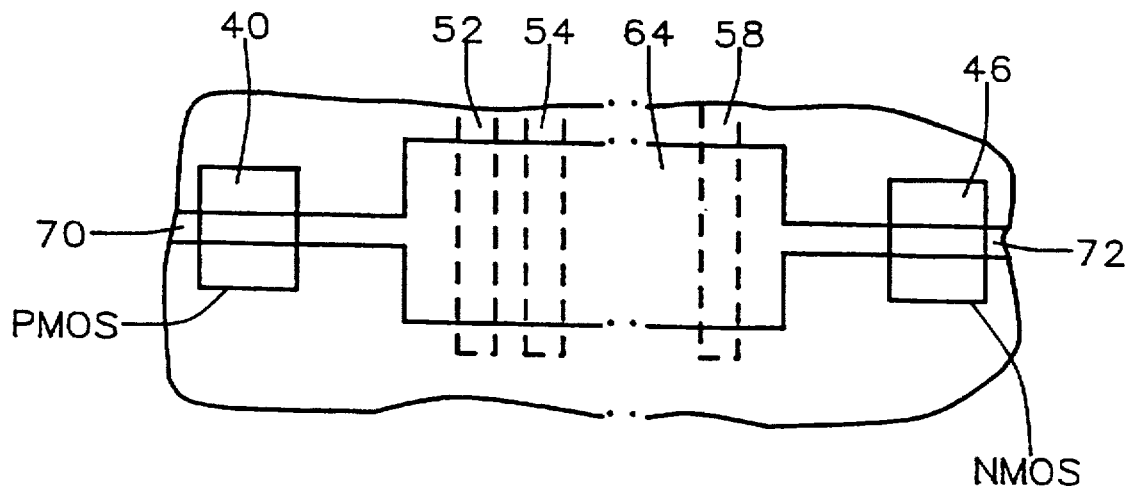
FIG. 4 shows a plan view of a device similar to the device of FIG. 3 indicating a large array of buried bit lines, a PMOS block is shown formed in an N well, a NMOS block in a P well, the buried N+ lines, and P-MOS and N-MOS floating gates.

FIG. 4 shows a plan view of a device similar to the device of FIG. 3, with the dotted lines indicating a far larger array of buried bit lines 52, 54 . . . 58 than the size of the array shown. A PMOS block is shown formed in N well 40, a NMOS block is shown in P well 46, and the buried N+ lines 52, 54 . . . 58 are shown in phantom beneath polysilicon 1 floating gate coupler 64 in P well 42. Line 70 comprises a P-MOS floating gate, and line 72 comprises an N-MOS floating gate.

The buried N+ ion implantation can also be done after polysilicon deposition through polysilicon ion implantation.

Additional Applications of Invention

Figure 5:
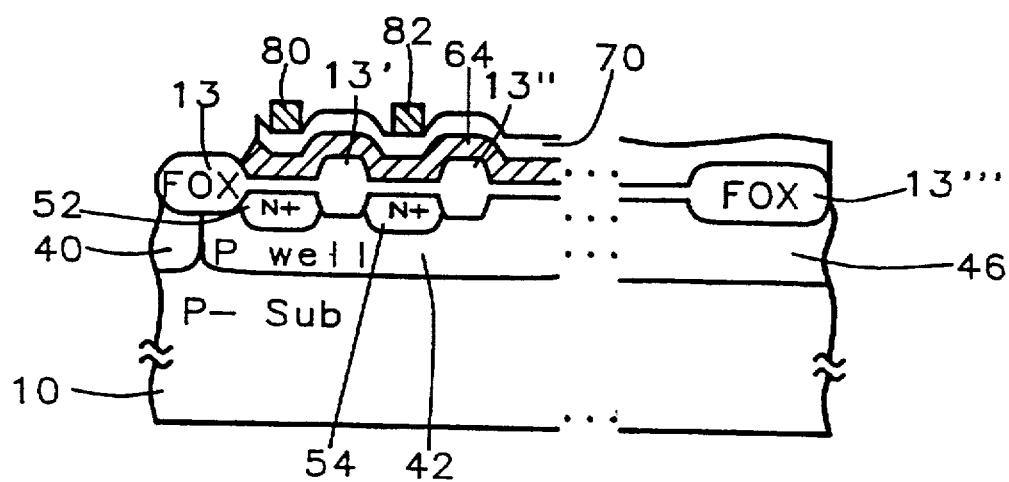
FIG. 5 is a sectional view of a modification of the design of the structure shown in FIG. 3 modified to include a double polysilicon process with an additional layer of polysilicon electrodes over the coupler electrode layer.

Referring to FIG. 5, a modification of the design of the structure shown in FIG. 3 is shown. In this case, the process of this invention is modified to include a double polysilicon process. That is, an additional layer of polysilicon electrodes 80 and 82 are shown over electrodes represented by electrode layer 64. The input electrodes can be either buried N+ lines 52, 54, 56, 57, 58 or polysilicon 2 lines 80, 82 and 86, which were deposited upon dielectric layer 70 above polysilicon 1 plate 64 with polysilicon 1 providing the control gate. In FIG. 5, the above process is combined with a double polysilicon layer process. The inputs are on two polysilicon 2 lines 80 and 82 and buried bit lines N+ 52 and 54 and polysilicon 1 structure 64 comprises a floating gate. In this case the coupling capacitor area can be reduced as compared to that without the buried N+ input lines 52, 54, etc. or without the polysilicon 2 structures 80 and 82 which overlie dielectric layer 70.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An integrated circuit device comprising:

a substrate having a surface region doped to a first conductivity type;

first and second field effect transistors on the substrate, the first and second field effect transistors having a common gate electrode, the first field effect transistor including a first source and a first drain in the substrate and a first channel region extending along a first direction between the first source and first drain under the common gate electrode, the second field effect transistor including a second source and a second drain and a second channel region extending along the first direction between the second source and the second drain under the common gate electrode;

an array of buried capacitor regions within the surface region, including an array of buried bit lines under the common gate electrode, the buried capacitor regions comprising distinct regions of increased dopant density as compared to adjacent portions of the surface region;

an insulating layer over the buried capacitor regions, the common gate electrode extending over the buried capacitor regions so that the common gate electrode is capacitively coupled to the buried capacitor regions through the insulating layer.

2. The device of claim 1, wherein the first field effect transistor is an NMOS device formed on a P-type surface region of the substrate and the second field effect transistor is a PMOS device formed on an N-type surface region.

3. The device of claim 1, wherein the buried capacitor regions are doped to a second conductivity type.

4. The device of claim 1, wherein the insulating layer is relatively thick over portions of the surface region between the buried capacitor region.

5. The device of claim 4, wherein the insulating layer is an oxide of silicon.

6. The device of claim 1, wherein the buried bit lines extend along a direction perpendicular to the first direction.

7. The device of claim 1, wherein the common gate is narrower over the first channel region and wider over the buried bit lines.

8. An integrated circuit device comprising:

a substrate having a surface region doped to a first conductivity type;

a first NMOS transistor on the substrate and a second PMOS transistor on the substrate, the first NMOS and the second PMOS transistors having a common gate electrode; the first NMOS transistor including a first source and a first drain in the substrate and a first channel region extending along a first direction between the first source and first drain under the common gate electrode, the second PMOS transistor including a second source and a second drain and a second channel region extending along the first direction between the second source and the second drain under the common gate electrode;

an array of buried capacitor regions within the surface region, under the common gate electrode including an array of buried bit lines under the common gate electrode, the buried capacitor regions comprising regions within the surface region doped to a second conductivity type;

an insulating layer over the buried capacitor regions, the common gate electrode extending over the buried capacitor regions so that the common gate electrode is capacitively coupled to the buried capacitor regions through the insulating layer.

9. The device of claim 8, wherein the buried bit lines extend along a direction perpendicular to the first direction.

10. The device of claim 9, wherein the common gate is narrower over the first channel region and wider over the buried bit lines.

* * * * *